United States Patent
Otsuka et al.

(10) Patent No.: US 12,371,570 B2
(45) Date of Patent: Jul. 29, 2025

(54) METHOD FOR PRODUCING SILICON-CONTAINING OXIDE-COATED ALUMINUM NITRIDE PARTICLES AND METHOD FOR PRODUCING EXOERGIC RESIN COMPOSITION

(71) Applicant: SHOWA DENKO K. K., Tokyo (JP)

(72) Inventors: Yuki Otsuka, Yokohama (JP); Naoki Minorikawa, Yokohama (JP); Ikue Kobayashi, Yokohama (JP)

(73) Assignee: Resonac Corporation, Tokyo (JP)

( * ) Notice: Subject to any disclaimer, the term of this patent is extended or adjusted under 35 U.S.C. 154(b) by 865 days.

(21) Appl. No.: 17/434,565

(22) PCT Filed: Nov. 11, 2020

(86) PCT No.: PCT/JP2020/041994
§ 371 (c)(1),
(2) Date: Aug. 27, 2021

(87) PCT Pub. No.: WO2021/095747
PCT Pub. Date: May 20, 2021

(65) Prior Publication Data
US 2022/0135805 A1 May 5, 2022

(30) Foreign Application Priority Data
Nov. 12, 2019 (JP) ................. 2019-205080

(51) Int. Cl.
C09C 1/40 (2006.01)
C08L 63/00 (2006.01)
C09C 3/06 (2006.01)

(52) U.S. Cl.
CPC ............... *C09C 1/40* (2013.01); *C08L 63/00* (2013.01); *C09C 3/063* (2013.01); *C01P 2004/61* (2013.01)

(58) Field of Classification Search
CPC . C09C 1/40; C09C 3/063; C08L 63/00; C01P 2004/61; C01P 2004/54;
(Continued)

(56) References Cited

U.S. PATENT DOCUMENTS 5,508,110 A 4/1996 Howard
5,923,945 A 7/1999 Eisman et al.
(Continued)

FOREIGN PATENT DOCUMENTS

CN 106810699 A * 6/2017 ............. C08G 77/12
JP 2000063872 A * 2/2000 ......... C01B 21/0728
(Continued)

OTHER PUBLICATIONS

Pang, CN-106810699-MT (Year: 2017).*
(Continued)

*Primary Examiner* — Robert S Jones, Jr.
*Assistant Examiner* — Zhen Liu
(74) *Attorney, Agent, or Firm* — Sughrue Mion, PLLC

(57) ABSTRACT

A method for producing silicon-containing oxide-coated aluminum nitride particles including aluminum nitride particles and a silicon-containing oxide coating covering a surface of each of the aluminum nitride particles. The method includes a first step including mixing aluminum nitride particles and an organic silicone compound solution in which an organic silicone compound containing a specific structure is dissolved in a solvent to form a mixture and then heating the mixture to remove the solvent and to obtain aluminum nitride particles coated with the organic silicone compound; and a second step including heating the aluminum nitride particles coated with the organic silicone compound at a temperature of 300° C. or more and 1,000° C. or less.

11 Claims, 1 Drawing Sheet

(58) Field of Classification Search
CPC ... C04B 41/009; C04B 41/4584; C04B 41/87; H01L 23/3733; H01L 23/3737; C08K 9/06; C08K 9/10; C08K 3/28; C08K 2003/282; C01B 21/0728
See application file for complete search history.

(56) References Cited

U.S. PATENT DOCUMENTS

| | | | |
|---|---|---|---|
| 9,356,098 B2 * | 5/2016 | Yamazaki | H01L 29/7869 |
| 9,356,152 B2 * | 5/2016 | Isa | H01L 27/124 |
| 2011/0011309 A1 * | 1/2011 | Nakagawa | C01G 9/02 |
| | | | 106/425 |

FOREIGN PATENT DOCUMENTS

| | | | | |
|---|---|---|---|---|
| JP | 3446053 | B2 | | 9/2003 |
| JP | 2004-83334 | A | | 3/2004 |
| JP | 2004083334 | A | * | 3/2004 |
| JP | 4088768 | B2 | | 5/2008 |
| JP | 4804023 | B2 | | 10/2011 |
| JP | 2015-71730 | A | | 4/2015 |
| JP | 2017088459 | A | * | 5/2017 |
| JP | 2018090488 | A | * | 6/2018 |
| WO | 93/25496 | A1 | | 12/1993 |
| WO | 98/21165 | A1 | | 5/1998 |

OTHER PUBLICATIONS

Inagi, JP-2017088459-MT (Year: 2017).*
Yamada, JP-2000063872-MT (Year: 2000).*
Kita, JP2018090488-MT (Year: 2018).*
Taro, JP2004083334-MT (Year: 2004).*
Taro, JP2004083334 (Year: 2004).*
International Search Report for PCT/JP2020/041994 dated, Feb. 25, 2021 (PCT/ISA/210).
Written Opinion of the International Searching Authority for PCT/JP2020/041994 dated Feb. 25, 2021 (PCT/ISA/237).

* cited by examiner

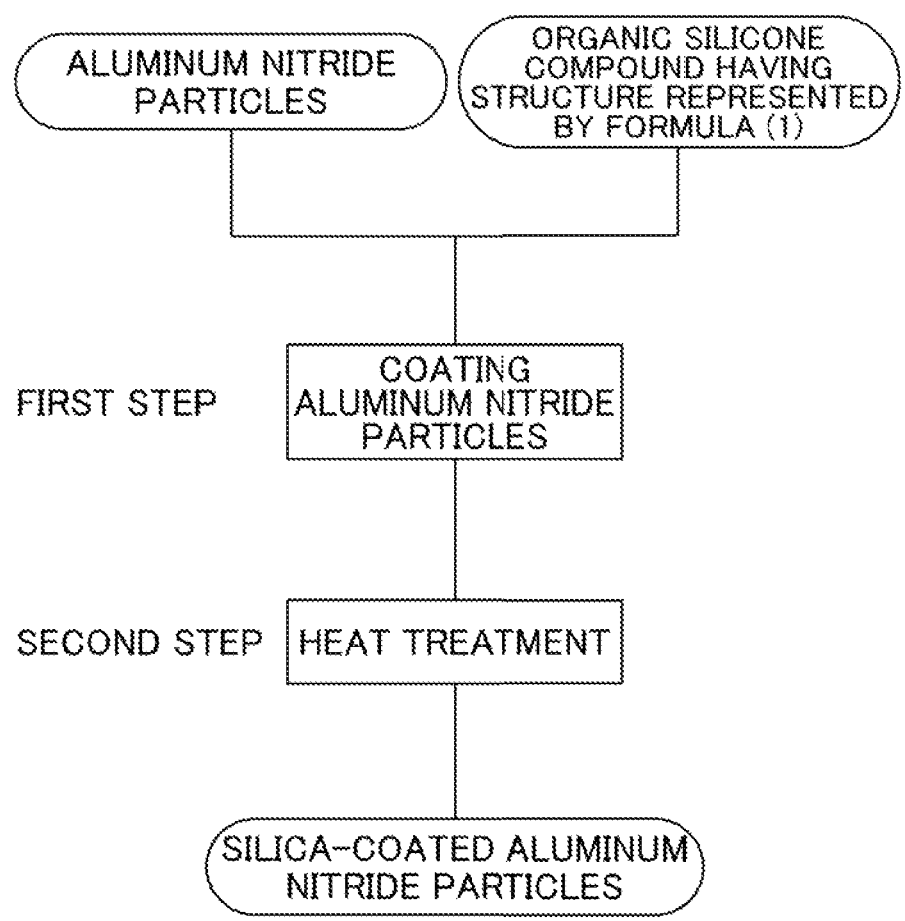

METHOD FOR PRODUCING SILICON-CONTAINING OXIDE-COATED ALUMINUM NITRIDE PARTICLES AND METHOD FOR PRODUCING EXOERGIC RESIN COMPOSITION

CROSS REFERENCE TO RELATED APPLICATIONS

This application is a National Stage of International Application No. PCT/JP2020/041994 filed Nov. 11, 2020, claiming priority based on Japanese Patent Application No. 2019-205080 filed Nov. 12, 2019.

TECHNICAL FIELD

The present invention relates to a method for producing silicon-containing oxide-coated aluminum nitride particles and a method for producing an exoergic resin composition containing silicon-containing oxide-coated aluminum nitride particles.

BACKGROUND ART

Aluminum nitride has high thermal conductivity and excellent electrical insulation properties. Therefore, aluminum nitride is promising as a filler for resin compositions used in such products as exoergic sheets (heat dissipation sheets) and sealing materials for electronic components. Unfortunately, aluminum nitride undergoes hydrolysis by reaction with water into aluminum hydroxide, which has low thermal conductivity. During hydrolysis of aluminum nitride, ammonia is also produced, which is corrosive.

Even moisture in the air allows hydrolysis of aluminum nitride to proceed. Under high-temperature, high-humidity conditions, therefore, aluminum nitride-containing products may not only undergo a reduction in moisture resistance or thermal conductivity but may also cause performance degradation such as corrosion by ammonia produced during hydrolysis of aluminum nitride.

Proposed techniques for providing improved moisture resistance to aluminum nitride include a method of forming a Si—Al—O—N layer on the surface of aluminum nitride powder (see, for example, Patent Document 1), a method of forming a coating layer on the surface of aluminum nitride powder using a silicate treatment agent and a coupling agent (see, for example, Patent Document 2), a method of treating the surface of aluminum nitride powder with a silicate treatment agent to leave organic groups on the surface (see, for example, Patent Document 3), and a method of modifying the surfaces of aluminum nitride particles using a specific acidic phosphate ester (see, for example, Patent Document 4).

Patent Document 1 discloses a moisture-resistant aluminum nitride powder produced by a process that includes applying a silicate ester layer onto the surface of an aluminum nitride powder and then firing the layer at a high temperature of 350 to 1,000° C. to form a Si—Al—O—N layer on the surface. Patent Document 2 discloses an aluminum nitride-based powder having a surface coating layer produced by surface treatment with a silicate treatment agent and a coupling agent and then high-temperature heat treatment. Patent Document 3 discloses that an aluminum nitride powder is surface-treated with a silicate treatment agent and then heated at a temperature not higher than 90° C. so that organic groups are left to provide improved compatibility with a resin. Patent Document 4 discloses surface-modified particles comprising aluminum nitride particles surface-treated with a specific acidic phosphate ester for improving moisture resistance.

CITATION LIST

Patent Literature

[PTL 1] Japanese Patent No. 3446053
[PTL 2] Japanese Patent No. 4088768
[PTL 3] Japanese Patent No. 4804023
[PTL 4] Japanese Unexamined Patent Application, Publication No. 2015-71730

SUMMARY OF INVENTION

Solution to Problem

Unfortunately, the conventional techniques have the following problems. The aluminum nitride powders mentioned above have a layer for improving moisture resistance, such as a Si—Al—O—N reactive layer, a coating layer made from a silicate treatment agent and a coupling agent, or a surface-modifying layer. As a result, such a layer improves moisture resistance. Unfortunately, however, the improvement remains at an unsatisfactory level, and the coating used as a means for improving moisture resistance often reduces the original thermal conductivity of aluminum nitride.

The present invention has been made to solve the above problems, and it is an object of the present invention to provide a method that enables production of silicon-containing oxide-coated aluminum nitride particles maintaining the high thermal conductivity of aluminum nitride particles and having improved moisture resistance, and to provide a method for producing an exoergic resin composition containing such silicon-containing oxide-coated aluminum nitride particles.

Means for Solving the Problems

As a result of extensive studies, the inventors have completed the present invention based on the findings that the above problems can be solved when aluminum nitride particles are coated by a specific method using an organic silicone compound solution containing a specific organic silicone compound dissolved in a solvent. Specifically, aspects of the present invention have the following features.

[1] A method for producing silicon-containing oxide-coated aluminum nitride particles including aluminum nitride particles and a silicon-containing oxide coating covering a surface of each of the aluminum nitride particles, the method including:

a first step including mixing aluminum nitride particles and an organic silicone compound solution in which an organic silicone compound having a structure represented by formula (1) below is dissolved in a solvent to form a mixture and then heating the mixture to remove the solvent and to obtain aluminum nitride particles coated with the organic silicone compound; and a second step including heating the aluminum nitride particles coated with the organic silicone compound at a temperature of 300° C. or more and 1,000° C. or less.

[Chem. 1]

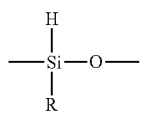
(1)

In formula (1), R is an alkyl group having 4 or less carbon atoms.

[2] The method according to aspect [1] for producing silicon-containing oxide-coated aluminum nitride particles, in which the organic silicone compound having the structure represented by formula (1) above includes at least one of a compound represented by formula (2) below and a compound represented by formula (3) below.

[Chem. 2]

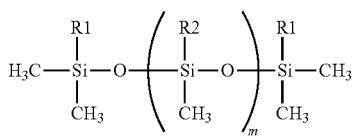
(2)

In formula (2), R1 and R2 are each independently a hydrogen atom or a methyl group, provided that at least one of R1 and R2 is a hydrogen atom, and m is an integer from 0 to 10.

[Chem. 3]

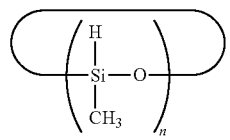
(3)

In formula (3), n is an integer from 3 to 6.

[3] The method according to aspect [1] or [2] for producing silicon-containing oxide-coated aluminum nitride particles, in which the aluminum nitride particles have a cumulative volume d50 of 10 μm or more and 60 μm or less.

[4] The method according to any one of aspects [1] to [3] for producing silicon-containing oxide-coated aluminum nitride particles, in which the heating in the first step is at a temperature of 35° C. or more and 200° C. or less.

A method for producing an exoergic resin composition, the method including a mixing step including mixing a resin and the silicon-containing oxide-coated aluminum nitride particles produced by the method according to any one of aspects [1] to [4].

Effects of the Invention

The present invention provides a method that enables production of silicon-containing oxide-coated aluminum nitride particles (for example, silica-coated aluminum nitride particles) maintaining high thermal conductivity and having improved moisture resistance and to provide a method for producing an exoergic resin composition containing such silicon-containing oxide-coated aluminum nitride particles.

BRIEF DESCRIPTION OF DRAWINGS

The FIGURE is a flowchart showing a method according to the present invention for producing silica-coated aluminum nitride particles.

DESCRIPTION OF EMBODIMENTS

Hereinafter, embodiments of the present invention (hereinafter referred to as "an embodiment or embodiments") will be described in detail. It will be understood that the embodiments described below are not intended to limit the present invention and may be altered or modified in various ways without departing from the gist of the present invention.

<<Method for Producing Silicon-Containing Oxide-Coated Aluminum Nitride Particles>>

An embodiment is directed to a method for producing silicon-containing oxide-coated aluminum nitride particles including: aluminum nitride particles; and a silicon-containing oxide coating that covers the surface of each of the aluminum nitride particles. The "silicon-containing oxide" in the silicon-containing oxide coating or the silicon-containing oxide-coated aluminum nitride particles may be silica or a complex oxide including silicon and aluminum, which will be described in detail below. Examples of the oxide include an oxide, an oxynitride, an oxycarbonitride, and the like. The method according to an embodiment for producing silicon-containing oxide-coated aluminum nitride particles includes a first step including mixing aluminum nitride particles and an organic silicone compound solution in which an organic silicone compound having a structure represented by formula (1) below is dissolved in a solvent to form a mixture and then heating the mixture to remove the solvent and to obtain aluminum nitride particles coated with the organic silicone compound; and a second step including heating the aluminum nitride particles coated with the organic silicone compound at a temperature of 300° C. or more and 1,000° C. or less.

[Chem. 4]

(1)

In formula (1), R is an alkyl group having 4 or less carbon atoms.

The method according to an embodiment for producing silicon-containing oxide-coated aluminum nitride particles will be described in detail with reference to the FIGURE. The FIGURE is a flowchart showing, as an example of the method according to an embodiment, a method for producing silica-coated aluminum nitride particles.

<Aluminum Nitride Particles>

In the method according to an embodiment for producing silicon-containing oxide-coated aluminum nitride particles, the aluminum nitride particles used as a raw material may be those known in the art, such as commercially available products. Examples of methods for producing aluminum nitride particles include, but are not limited to, a direct nitridation method including allowing metallic aluminum powder to react directly with nitrogen or ammonia; and a reductive nitridation method including heating alumina in a nitrogen or ammonia atmosphere for nitridation while reducing the alumina with carbon.

The aluminum nitride particles may also be granulated particles produced by sintering aggregates of aluminum nitride fine particles. In particular, the aluminum nitride particles are preferably sintered granules produced using, as a raw material, high-purity aluminum nitride fine particles having a cumulative volume d50 of about 1 μm.

As used herein, the term "high-purity aluminum nitride fine particles" refers to aluminum nitride particles with a low oxygen content and a low metal impurity content. Specifically, for example, high-purity aluminum nitride particles with an oxygen content of 1% by mass or less and a total content of metal impurities (i.e., metal atoms other than aluminum) of 1,000 ppm by mass or less are preferred for the purpose of imparting higher thermal conductivity from the aluminum nitride particles to the silicon-containing oxide-coated aluminum nitride particles. A single type of aluminum nitride particles may be used, or two or more types of aluminum nitride particles may be used in combination.

The content of oxygen mentioned above can be measured, for example, with an inorganic analysis instrument equipped with an infrared oxygen sensor. Specifically, the oxygen content can be measured with an oxygen/nitrogen/hydrogen analyzer (e.g., ONH836 available from LECO Japan Corporation).

The total content of metal atoms other than aluminum can be measured, for example, with an inductively coupled plasma (ICP) mass spectrometer. Specifically, the total content of metal atoms other than aluminum can be measured with an ICP mass spectrometer (e.g., ICPMS-2030 manufactured by Shimadzu Corporation).

As used herein, the term "cumulative volume d50" regarding the cumulative volume of particles refers to a particle diameter at which the cumulative volume reaches 50% in a certain particle size distribution. The cumulative volume d50 may be determined by a laser diffraction scattering method, and specifically, the cumulative volume d50 may be determined using a laser diffraction/scattering particle size distribution analyzer (e.g., Microtrac MT3300EX2 manufactured by MicrotracBEL Corporation).

The shape of the aluminum nitride particles used in an embodiment may be, but not limited to, amorphous (crushed), spherical, elliptic, or plate-like (scale-like). The silicon-containing oxide-coated aluminum nitride particles may be dispersed as an exoergic filler to form an exoergic resin composition. For such a purpose, a single type of aluminum nitride particles having a single type of shape or structure may be used, or two or more different types of aluminum nitride particles having different shapes or structures may be mixed in any ratio to form a mixture of aluminum nitride particles.

When the silicon-containing oxide-coated aluminum nitride particles are dispersed in an exoergic resin composition, the thermal conductivity of the exoergic resin composition increases with increasing volume fraction of aluminum nitride particles (filler content) constituting the silicon-containing oxide-coated aluminum nitride particles in the exoergic resin composition. Therefore, the aluminum nitride particles preferably have shapes close to spherical shapes, which can reduce the increase in the viscosity of the exoergic resin composition caused by the addition of the silicon-containing oxide-coated aluminum nitride particles.

The aluminum nitride particles preferably have an average aspect ratio (as an index of particle shape) of 0.8 or more and 1.0 or less, more preferably 0.85 or more and 1.0 or less, and even more preferably 0.9 or more and 1.0 or less. In this regard, the average aspect ratio of the aluminum nitride particles may be the arithmetic average of the D1/D2 ratios of electron microscope images of 100 particles selected randomly, in which D1 and D2 are the lengths of the minor and major axes of each particle, respectively. In this regard, the minor axis length D1 is the smallest distance between two parallel lines tangent to the electron microscope image of each aluminum nitride particle, and the major axis length D2 is the largest distance between two parallel lines tangent to the electron microscope image of each aluminum nitride particle.

The aluminum nitride particles used in an embodiment preferably has a cumulative volume d50 of 0.2 μm or more and 200 μm or less, more preferably 10 μm or more and 100 μm or less, even more preferably 10 μm or more and 60 μm or less, and further more preferably 15 μm or more and 50 μm or less.

When the cumulative volume d50 of the aluminum nitride particles falls within the above range, not only an exoergic material for mounting power electronics components can be produced as thin as possible using the exoergic resin composition containing the silicon-containing oxide-coated aluminum nitride particles, but also more improved moisture resistance can be provided for the aluminum nitride particles since it is easy to uniformly coat the surfaces of the aluminum nitride particles with the coating.

In the method according to an embodiment for producing silicon-containing oxide-coated aluminum nitride particles, a thin coating layer of a silicon-containing oxide can be formed, and therefore, the use of relatively fine aluminum nitride particles with a cumulative volume d50 of 50 μm or less has a small influence on the thermal conductivity. As shown in the Examples section below, higher thermal conductivity can be provided using aluminum nitride particles with a cumulative volume d50 of 30 μm or less.

<Organic Silicone Compound Used for Coating>

In the method according to an embodiment for producing silicon-containing oxide-coated aluminum nitride particles, an organic silicone compound is used as a raw material for a silicon-containing oxide coating, which forms the silicon-containing oxide-coated aluminum nitride particles. The organic silicone compound may be any organic silicone compound having the structure represented by formula (1) above, regardless of its form, such as a linear, cyclic, or branched chain form. The structure represented by formula (1) is a hydrogen siloxane unit having a hydrogen atom directly bonded to the silicon atom.

In formula (1), the alkyl group having 4 or less carbon atoms for R is preferably, for example, methyl, ethyl, propyl, or tert-butyl, and more preferably methyl. In the method according to an embodiment for producing silicon-containing oxide-coated aluminum nitride particles, the organic silicone compound used as a raw material is, for example, an oligomer or polymer having the structure represented by formula (1).

The organic silicone compound is preferably, for example, at least one of a compound represented by formula (2) below and a compound represented by formula (3) below.

[Chem. 5]

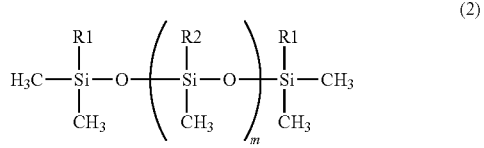

(2)

In formula (2), R1 and R2 are each independently a hydrogen atom or a methyl group, provided that at least one of R1 and R2 is a hydrogen atom, and m is an integer from 0 to 10.

[Chem. 6]

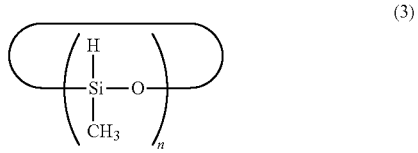

(3)

In formula (3), n is an integer from 3 to 6.

In particular, a cyclic hydrogen siloxane oligomer represented by formula (3) in which n is 4 is superior in that it can form a uniform coating on the surfaces of the aluminum nitride particles. The organic silicone compound having the structure represented by formula (1) preferably has a weight average molecular weight of 100 or more and 2,000 or less, more preferably 150 or more and 1,000 or less, and even more preferably 180 or more and 500 or less. It is expected that, using the organic silicone compound having the structure represented by formula (1) and having a weight average molecular weight in this range, a thin and uniform coating can be easily formed on the surfaces of the aluminum nitride particles. In formula (2), m is preferably 1.

As used therein, the term "weight average molecular weight" refers to a polystyrene-equivalent weight average molecular weight determined using gel permeation chromatography (GPC). Specifically, the weight average molecular weight may be measured using a combination of a column (e.g., Shodex (trade name) LF-804 manufactured by Showa Denko K.K.) and a differential refractive index detector (e.g., Shodex (trade name) RI-71S manufactured by Showa Denko K.K.).

<First Step>

In the first step, surfaces of the aluminum nitride particles are coated with the organic silicone compound having the structure represented by formula (1).

In the first step, firstly, the aluminum nitride particles are mixed with an organic silicone compound solution in which the organic silicone compound having the structure represented by formula (1) is dissolved in a solvent. The solvent for dissolving the organic silicone compound having the structure represented by formula (1) is typically, but not limited to, an organic solvent such as dichloromethane ($CH_2Cl_2$) or toluene. The concentration of the organic silicone compound having the structure represented by formula (1) in the organic silicone compound solution is typically, but not limited to, 0.10% by mass or more and 60% by mass or less, and preferably 0.30% by mass or more and 40% by mass or less.

The mixture is then heated so that the solvent is removed by volatilization. As a result, aluminum nitride particles coated with the organic silicone compound are obtained. In the first step, the heating temperature may be set to any temperature that does not allow volatilization of the organic silicone compound having the structure represented by formula (1) but allows sufficient volatilization of the solvent used. In the first step, the heating temperature is preferably 35° C. or more and 200° C. or less, more preferably 40° C. or more and 150° C. or less, and even more preferably 40° C. or more and 100° C. or less. In this step, the pressure may be normal or reduced pressure.

The amount of the organic silicone compound having the structure represented by formula (1) used in the first step is preferably, but not limited to, 0.02 parts by mass or more and 50 parts by mass or less, more preferably 0.1 parts by mass or more and 25 parts by mass or less, and even more preferably 0.2 parts by mass or more and 20 parts by mass or less, based on 100 parts by mass of the aluminum nitride particles. The amount to be used may be determined assuming that the whole amount of the organic silicone compound having the structure represented by formula (1) can be deposited on the aluminum nitride particles.

In the first step, the heating may be performed, for example, in an atmosphere of an inert gas such as $N_2$, Ar, or He or in an atmosphere containing a reducing gas such as $H_2$, CO, or $CH_4$, which is non-limiting. Preferably, the heating is performed in an atmosphere containing oxygen gas, such as the atmosphere (air).

<Second Step>

In the second step, the aluminum nitride particles coated with the organic silicone compound obtained in the first step are heated at a temperature of 300° C. or more and 1000° C. or less, preferably 350° C. or more and 950° C. or less, and more preferably 500° C. or more and 900° C. or less. This results in successful formation of a silicon-containing oxide coating on the surfaces of the aluminum nitride particles. When the heating in the second step is at a low temperature, a silica coating will be formed as a silicon-containing oxide coating on the surfaces of the aluminum nitride particles, so that silica-coated aluminum nitride particles will be produced. When the heating in the second step is at a high temperature, a coating of a complex oxide including silicon and aluminum will be formed as a silicon-containing oxide coating on the surfaces of the aluminum nitride particles, so that aluminum-silicon complex oxide-coated aluminum nitride particles will be produced. It is suggested that, as the temperature in the second step increases, aluminum comes out from the inside onto the surface of the aluminum nitride particle to form a complex oxide with silicon, which is derived from the organic silicone compound, so that a coating of a complex oxide including silicon and aluminum is formed. The second step may be performed using a general heating furnace that can heat the organic silicone compound-coated aluminum nitride particles, which are obtained in the first step, at a temperature of 300° C. or more and 1000° C. or less, in other words, can maintain the temperature of the organic silicone compound-coated aluminum nitride particles in the range of 300° C. to 1000° C.

In the heat treatment in the second step (heating at a temperature of 300° C. or more and 1000° C. or less), the organic silicone compound having the structure represented by formula (1), with which the surfaces of the aluminum nitride particles are coated, is considered to undergo dehydrogenation at the initial stage, which allows the bonding between the molecules of the organic silicone compound or the bonding of the organic silicone compound to hydroxyl groups on the surfaces of the aluminum nitride particles, so that the coating is made stronger. At the final stage of the heat treatment, the organic group (an alkyl group having 4 or less carbon atoms) of the organic silicone compound undergoes decomposition and volatilization. Therefore, the resulting silicon-containing oxide coating has a low carbon atom content (content of carbon atoms), which leads to a low content of carbon atoms in the silicon-containing oxide-coated aluminum nitride particles. This makes it possible to obtain silicon-containing oxide-coated aluminum nitride particles with a carbon atom content of less than 1,000 ppm by mass, preferably less than 500 ppm by mass, and more preferably less than 250 ppm by mass. The silicon-containing oxide-coated aluminum nitride particles with a carbon atom content in the above range tend to have good moisture resistance and are less vulnerable to the influence of localized carbon particles on insulating or other properties.

In this regard, the term "silica coating" means a coating of a thin film composed mainly of silica. It should be noted that a plurality of inorganic composites may exist at the interface between the silica coating and the aluminum nitride particle, so that, when the coating is analyzed by Time of Flight Secondary Ion Mass Spectrometry (TOF-SIMS) (e.g. using TOF.SIMS 5 manufactured by IONTOF GmbH), sub-component segments such as $AlSiO_4$ and SiNO ions may also be detected since recombination of secondary ions and ionization-induced decomposition may also occur during the analysis. Such complex segments determined by TOF-SIMS analysis may also be classified as detected partial products from silica-coated aluminum nitride. As a guide, the coating may be determined to be composed mainly of silica when the quantity of secondary electrons from silica is larger than the quantity of secondary electrons from other fractions.

An experiment for determining the purity of silica with a higher accuracy may further be performed, which includes using an X-ray Photoelectron Spectrometer (XPS) (e.g., Quantera II manufactured by ULVAC-PHI, Inc.) to analyze the surface of a sample including a silica coating formed by the same process on an aluminum nitride polycrystalline substrate, in which, if the detected kinetic energy of Si-derived photoelectrons is substantially equal to 103.7 eV for the standard peak, the coating may be considered to be composed almost entirely of a $SiO_2$ structure. It should be noted that, in some cases, organic components may remain depending on the heating temperature. Organic siloxane components may well be allowed to coexist as long as the effects of the present invention are not impaired.

The content of carbon atoms can be measured, for example, with a carbon/sulfur analyzer by a non-dispersive infrared absorption method using a tubular electric furnace system. Specifically, the carbon content may be measured using a carbon/sulfur analyzer (e.g., Carbon Analyzer EMIA-821 manufactured by Horiba, Ltd.)

In the second step, the heating temperature (heat treatment temperature) is 300° C. or more and 1,000° C. or less, preferably 350° C. or more and 950° C. or less, and more preferably 500° C. or more and 900° C. or less. When the heating is performed in this temperature range, a silicon-containing oxide coating having good moisture resistance and good thermal conductivity is formed. Specifically, the heating at 300° C. or more results in good moisture resistance probably due to the formation of a densified silicon-containing oxide coating, which is less permeable to water. The heating at 1,000° C. or less, preferably 950° C. or less, and more preferably 900° C. or less, also results in good thermal conductivity. On the other hand, heating at more than 1,000° C. will result in poor moisture resistance or poor thermal conductivity. When the heating temperature is 300° C. or more and 1,000° C. or less, preferably 350° C. or more and 950° C. or less, and more preferably 500° C. or more and 900° C. or less, a silicon-containing oxide coating is uniformly formed on the surfaces of the aluminum nitride particles. The heating at a temperature of 300° C. or more will result in formation of a silicon-containing oxide coating with excellent insulating properties, and the heating at a temperature of 1,000° C. or less, preferably 950° C. or less, and more preferably 900° C. or less reduces the energy cost. The heating temperature is preferably 350° C. or more, more preferably 500° C. or more, and even more preferably 650° C. or more.

The time duration of the heating is preferably 30 minutes or more and 12 hours or less, more preferably 30 minutes or more and 6 hours or less, and even more preferably 45 minutes or more and 4 hours or less. The heat treatment for a time period of 30 minutes or more is advantageous in that the organic silicone compound can be decomposed with no decomposition product residue from the organic group (the alkyl group having 4 or less carbon atoms), so that a silicon-containing oxide coating with a very low content of carbon atoms can be formed on the surfaces of the aluminum nitride particles. The heating for a time period of 6 hours or less is also advantageous in that the silicon-containing oxide-coated aluminum nitride particles can be produced with high efficiency.

In the second step, the heat treatment may be performed, for example, in an atmosphere of an inert gas such as $N_2$, Ar, or He or in an atmosphere containing a reducing gas such as $H_2$, CO, or $CH_4$, which is non-limiting. Preferably, the heat treatment is performed in an atmosphere containing oxygen gas, such as the atmosphere (air).

In the second step, the heat treatment may result in fusion of some of the silicon-containing oxide-coated aluminum nitride particles. In such a case, the fused particles may be ground to give non-fused, non-aggregated silicon-containing oxide-coated aluminum nitride particles. The grinding may be performed using any suitable device including a typical grinder such as a roller mill, a hammer mill, a jet mill, or a ball mill.

After the second step is completed, the first step and the second step may be sequentially performed again. In other words, the process that includes performing the first and second steps sequentially may be repeated.

The method according to an embodiment for producing silicon-containing oxide-coated aluminum nitride particles enables the formation of a thin, uniform, silicon-containing oxide coating. Therefore, the aluminum nitride particles can provide high thermal conductivity even when the process that includes performing the first and second steps sequentially is repeated a number of times, e.g., 2 to 5 times.

On the other hand, the level of moisture resistance is found to be positively correlated with the number of times the process is performed with the first and second steps sequentially. Therefore, the number of times the process is performed with the first and second steps sequentially may be freely selected according to the level of moisture resistance required for practical applications.

The silicon-containing oxide-coated aluminum nitride particles resulting from the production method according to an embodiment maintain the original high thermal conductivity of the aluminum nitride particles and have excellent moisture resistance, as shown in the Examples section below. Therefore, the resulting silicon-containing oxide-coated aluminum nitride particles are widely suitable for use as a filler for exoergic materials used in the field of electrical and electronic applications.

The silicon-containing oxide-coated aluminum nitride particles produced by the method according to an embodiment described above, in other words, the silicon-containing oxide-coated aluminum nitride particles including aluminum nitride particles and a silicon-containing oxide coating covering a surface of each of the aluminum nitride particles may have a carbon atom content of less than 1,000 ppm by mass, preferably less than 500 ppm by mass, and more preferably less than 250 ppm by mass.

As described above, the silicon-containing oxide-coated aluminum nitride particles produced by the method according to an embodiment have excellent moisture resistance. For example, the silicon-containing oxide-coated aluminum nitride particles are such that, when they are added into an aqueous hydrochloric acid solution with an adjusted pH of 4 and then treated at 85° C. for 2 hours (in other words, when the silicon-containing oxide-coated aluminum nitride particles are immersed in an aqueous hydrochloric acid solution with an adjusted pH of 4 at 85° C. for 2 hours), the concentration of ammonia extracted into the aqueous hydrochloric acid solution is 35 mg/L or less, which indicates very high moisture resistance. In this regard, an accelerated test for moisture resistance can be achieved by the exposure of the particles to the aqueous hydrochloric acid solution with an adjusted pH of 4, since hydrolysis is accelerated in the acidic solution as compared to hydrolysis in air. Therefore, the moisture resistance of the silicon-containing oxide-coated aluminum nitride particles is successfully evaluated using an aqueous hydrochloric acid solution at pH 4, and the ammonia concentration of 35 mg/L or less is considered to indicate good moisture resistance. Moreover, the use of the aqueous hydrochloric acid solution at pH 4 also makes it possible to make a comparison for chemical resistance. The concentration of the extracted ammonia is preferably 20 mg/L or less, and more preferably 10 mg/L or less. For the moisture resistance, the lower the carbon atom content, the better. In this regard, the silicon-containing oxide-coated aluminum nitride particles often contain carbon atoms, and, in some cases, contain carbon atoms typically at 50 ppm by mass or more or at 60 ppm by mass or more, since the organic silicone compound having the structure represented by formula (1) is used as a raw material in the production method according to an embodiment described above. As described above, however, excellent moisture resistance can be provided when the carbon atom content is less than 1,000 ppm by mass, preferably less than 500 ppm by mass, and more preferably less than 250 ppm by mass.

The content of silicon atoms (silicon atom content) in the silicon-containing oxide-coated aluminum nitride particles produced by the method according to an embodiment described above is typically, but not limited to, 5,000 ppm by mass or less, preferably 3,000 ppm by mass or less, more preferably 2,800 ppm by mass or less, and even more preferably 2,600 ppm by mass or less. The content of silicon atoms in the silicon-containing oxide-coated aluminum nitride particles is typically 100 ppm by mass or more.

When determined by BET method, the specific surface area of the silicon-containing oxide-coated aluminum nitride particles produced by the method according to an embodiment described above is typically, but not limited to, 0.08 m$^2$/g or more and 0.90 m$^2$/g or less, preferably 0.10 m$^2$/g or more and 0.80 m$^2$/g or less, and more preferably 0.12 m$^2$/g or more and 0.70 m$^2$/g or less.

Regarding the silicon-containing oxide-coated aluminum nitride particles produced by the method according to an embodiment described above, the ratio of the content of silicon atoms to the specific surface area determined by BET method (content of silicon atoms/BET specific surface area) is typically, but not limited to, 850 mass ppm·g/m$^2$ or more and 1,800 mass ppm·g/m$^2$ or less, preferably 900 mass ppm·g/m$^2$ or more and 1,700 mass ppm·g/m$^2$ or less, and more preferably 950 mass ppm·g/m$^2$ or more and 1,650 mass ppm·g/m$^2$ or less.

The content of silicon atoms can be measured by an ICP method. The BET specific surface area of the silicon-containing oxide-coated aluminum nitride particles can be measured by a single point BET nitrogen adsorption method using a gas flow method. The system for evaluation of the measurements may be Macsorb HM Model 1210 manufactured by Mountech Co., Ltd.

<<Method for Producing Exoergic Resin Composition>>

An exoergic resin composition may be produced using the silicon-containing oxide-coated aluminum nitride particles produced by the method according to an embodiment described above. Specifically, a method according to an embodiment for producing an exoergic resin composition includes a mixing step including mixing a resin and the silicon-containing oxide-coated aluminum nitride particles produced by the method described above. The "silicon-containing oxide" in the silicon-containing oxide coating or the silicon-containing oxide-coated aluminum nitride particles may be silica or a complex oxide including silicon and aluminum as described above. Examples of the oxide include an oxide, an oxynitride, an oxycarbonitride, and the like. The silicon-containing oxide-coated aluminum nitride particles produced by the method described above maintain the high thermal conductivity of the aluminum nitride particles and have improved moisture resistance. Therefore, the exoergic resin composition obtained by the method according to an embodiment has excellent moisture resistance and excellent thermal conductivity.

In the mixing step, a resin is mixed with the silicon-containing oxide-coated aluminum nitride particles produced by the method described above.

While the resin to be mixed in the mixing step may be any type, the resin is preferably a thermosetting resin, a thermoplastic resin, or a mixture of a thermosetting resin and a thermoplastic resin in order to obtain an exoergic resin composition with excellent heat resistance. Examples of the thermosetting resin include silicone resins, epoxy resins, phenolic resins, bismaleimide resins, cyanate resins, urethane resins, (meta)acrylic resins, vinyl ester resins, unsaturated polyester resins, and polyvinyl alcohol acetal resins, which may be used singly or two or more of which may be used in combination. A mixture of a thermosetting resin and a curing agent or a curing accelerator may also be used. In particular, an epoxy resin is preferred in terms of good heat resistance, adhesiveness, and electrical characteristics after curing, and a silicone resin is preferred for applications in which flexibility and adhesion are important.

Examples of the silicone resin include addition reaction-curable silicone resins, condensation reaction-curable silicone resins, and organic peroxide-curable silicone resins. Such silicone resins may be used singly, or two or more of such silicone resins with different levels of viscosity may be used in combination. In particular, when the exoergic resin composition to be obtained is for use in applications where flexibility and adhesion are important, for example, the silicone resin may be an addition reaction-curable liquid silicone resin, which can be prevented from forming by-products that can cause foams. An alkenyl group-containing organopolysiloxane as a base polymer and an Si—H group-containing organopolysiloxane as a cross-linking agent may be allowed to react in the presence of a curing agent at room temperature or by heating to give a cured silicone resin product. Examples of the organopolysiloxane as a base polymer include those having a vinyl group, an allyl group, a propenyl group, or a hexenyl group as the alkenyl group. In particular, the organopolysiloxane preferably has a vinyl group. A curing catalyst such as a platinum metal-containing curing catalyst may also be used. The amount of addition of the curing catalyst may be adjusted in order to produce a cured resin product with a desired hardness.

Examples of the epoxy resin include difunctional glycidyl ester epoxy resins such as bisphenol A epoxy resins, bisphenol F epoxy resins, bisphenol S epoxy resins, hydrogenated bisphenol A epoxy resins, and biphenyl epoxy resins; glycidyl ester epoxy resins such as hexahydrophthalic acid glycidyl esters and dimer acid glycidyl esters; linear aliphatic epoxy resins such as epoxidized polybutadiene and epoxidized soybean oil; heterocyclic epoxy resins such as triglycidyl isocyanurate; glycidyl amine epoxy resins such as N,N,N',N'-tetraglycidyl-4,4'-diaminodiphenylmethane, N,N,N',N'-tetraglycidyl-1,3-benzenedi(methanamine), 4-(glycidyloxy)-N,N-diglycidylaniline, and 3-(glycidyloxy)-N,N-diglycidylaniline; and polyfunctional glycidyl ether epoxy resins such as phenol novolac epoxy resins, cresol novolac epoxy resins, biphenyl aralkyl epoxy resins, naphthalene aralkyl epoxy resins, tetrafunctional naphthalene epoxy resins, and triphenylmethane epoxy resins. These epoxy resins may be used singly, or two or more of these epoxy resins may be used in combination.

When the epoxy resin is used, a curing agent or a curing accelerator may be blended with the epoxy resin. Examples of the curing agent include alicyclic acid anhydrides such as methyltetrahydrophthalic anhydride, methylhexahydrophthalic anhydride, and himic anhydride; aliphatic acid anhydrides such as dodecenyl succinic anhydride; aromatic acid anhydrides such as phthalic anhydride and trimellitic anhydride; bisphenols such as bisphenol A, bisphenol F, and bisphenol S; phenolic resins such as phenol-formaldehyde resins, phenol-aralkyl resins, naphthol-aralkyl resins, and phenol-dicyclopentadiene copolymer resins; and organic hydrazides such as dicyandiamide and adipic acid dihydrazide. Examples of the curing accelerator include amines such as tris(dimethylaminomethyl)phenol, dimethylbenzylamine, 1,8-diazabicyclo(5,4,0)undecane, and derivatives thereof; and imidazoles such as 2-methylimidazole, 2-ethyl-4-methylimidazole, and 2-phenylimidazole. These compounds may be used singly, or two or more of these compounds may be used in combination.

In the mixing step, a common filler such as boron nitride, alumina, silica, or zinc oxide may be used in combination with the silicon-containing oxide-coated aluminum nitride particles.

In the mixing step, the silicon-containing oxide-coated aluminum nitride particles and any other filler may be mixed in amounts that are enough to form the desired exoergic resin composition. The total content of the silicon-containing oxide-coated aluminum nitride particles and other fillers in the resulting exoergic resin composition is preferably 50% by volume or more and 95% by volume or less, more preferably 60% by volume or more and 90% by volume or less, and even more preferably 70% by volume or more and 90% by volume or less. When the total content is 50% by volume or more, the exoergic resin composition can have good exoergic properties, and when the total content is 95% by volume or less, the exoergic resin composition can have good workability during use.

The content of the silicon-containing oxide-coated aluminum nitride particles in the resulting exoergic resin composition is preferably 30% by volume or more and 100% by volume or less, more preferably 40% by volume or more and 100% by volume or less, and even more preferably 50% by volume or more and 100% by volume or less of the total content of the silicon-containing oxide-coated aluminum nitride particles and other fillers. When the total content is 30% by volume or more, the composition can have good exoergic properties.

In the mixing step, if necessary, any appropriate materials may be added, such as a flexibility imparting agent such as silicone, urethane acrylate, butyral resin, acrylic rubber, diene-based rubber, or a copolymer thereof; a silane coupling agent, a titanium coupling agent, an inorganic ion trapping agent, a pigment, a dye, a diluent, and a solvent.

The mixing step may be performing using any mixing method, such as a method that includes mixing, dissolving, or kneading the silicon-containing oxide-coated aluminum nitride particles, the resin, and optional additives at one time or in divided amounts using one or any combination of a grinding machine, a planetary mixer, a rotating/revolving mixer, a kneader, a roll mill, and other dispersing/dissolving machines optionally under heating.

The resulting exoergic resin composition may be formed and optionally allowed to react into a formed product for use. For example, the resulting exoergic resin composition may be formed into a sheet and optionally allowed to react to give an exoergic sheet. The exoergic resin composition and the formed product such as the exoergic sheet are suitable for use in bonding applications for semiconductor power devices and power modules, and other applications. Examples of methods for producing the formed product will be described, which includes examples of methods for producing a sheet-shaped product such as an exoergic sheet.

Examples of methods for producing a sheet-shaped product such as an exoergic sheet include a method that includes sandwiching both sides of the exoergic resin composition between base films and subjecting the composition to compression pressing; and a method that includes applying the exoergic resin composition onto a base film using a bar coater, a screen printing machine, a blade coater, a die coater, a comma coater, or other devices. The sheet-shaped product such as the exoergic sheet obtained after the forming or application may be further subjected to additional treatment steps such as a solvent-removing step, B-staging, for example, by heating, and complete curing. As described above, these steps can provide a wide variety of sheet-shaped products such as exoergic sheets and can address a wide variety of target application fields and usages.

When the exoergic resin composition is applied to or formed on the base film, a solvent may be used to improve workability. Examples of such a solvent include, but are not limited to, ketone solvents such as acetone, methyl ethyl ketone, methyl isobutyl ketone, cyclopentanone, and cyclohexanone; ether solvents such as 1,4-dioxane, tetrahydrofuran, and diglyme; glycol ether solvents such as methyl cellosolve, ethyl cellosolve, propylene glycol monomethyl ether, propylene glycol monoethyl ether, propylene glycol monobutyl ether, propylene glycol monomethyl ether acetate, propylene glycol monoethyl ether acetate, and diethylene glycol methyl ethyl ether; other solvents such as benzyl alcohol, N-methylpyrrolidone, γ-butyrolactone, ethyl acetate, and N,N-dimethylformamide, which may be used singly or two or more of which may be used in combination.

To be shaped into a sheet, the exoergic resin composition should have a sheet-forming ability for holding a sheet shape. To impart a sheet-forming ability, a high molecular weight component may be added to the exoergic resin composition. Examples of such a high molecular weight component include phenoxy resins, polyimide resins, polyamide resins, polycarbodiimide resins, cyanate ester resins, (meth)acrylic resins, polyester resins, polyethylene resins, polyethersulfone resins, polyetherimide resins, polyvinyl acetal resins, urethane resins, and acrylic rubbers. In particular, for good thermal resistance and high film-forming ability, phenoxy resins, polyimide resins, (meth)acrylic resins, acrylic rubbers, cyanate ester resins, and polycarbodiimide resins are preferred, and phenoxy resins, polyimide resins, (meth)acrylic resins, and acrylic rubbers are more preferred. They may be used singly, or two or more of them may be used in the form of a mixture or a copolymer.

The high molecular weight component preferably has a weight average molecular weight of 10,000 or more and 100,000 or less, and more preferably 20,000 or more and 50,000 or less.

When the component with a weight average molecular weight in the above range is added to the composition, the composition can be successfully formed into a sheet with good handleability.

In order to maintain the sheet-forming ability, the amount of addition of the high molecular weight component is preferably, but not limited to, 0.1% by mass or more and 20% by mass or less, more preferably 1% by mass or more and 15% by mass or less, and even more preferably 2% by mass or more and 10% by mass or less. When the amount of addition is 0.1% by mass or more and 20% by mass or less, a good sheet or film with good handleability can be formed.

The base film for use during the production of the sheet-shaped product such as the exoergic sheet may be any film that withstands process conditions such as heating and drying during production, such as a film of an aromatic ring-containing polyester such as polyethylene terephthalate (PET) or polybutylene terephthalate (PBT), a polypropylene film, a polyimide film, or a polyetherimide film. The film described above may be a multilayer film composed of two or more layers or a film having a surface treated with a release agent such as a silicone release agent. The base film preferably has a thickness of 10 μm or more and 100 μm or less.

The sheet-shaped product, such as the exoergic sheet, formed on the base film preferably has a thickness of 20 μm or more and 500 μm or less, and more preferably 50 μm or more and 200 μm or less. The sheet with a thickness of 20 μm or more can be uniform in composition, and the sheet with a thickness of 500 μm or less can have good exoergic properties.

EXAMPLES

Hereinafter, the present invention will be more specifically described with reference to Examples and Comparative Examples, which are not intended to limit the scope of the present invention at all.

<Measurement of the Content of Carbon Atoms in Silicon-Containing Oxide-Coated Aluminum Nitride Particles>

The content of carbon atoms in silicon-containing oxide-coated aluminum nitride particles was measured using a carbon/sulfur analyzer (Carbon Analyzer EMIA-821 manufactured by Horiba, Ltd.) by a non-dispersive infrared absorption method using a tubular electric furnace system.

<Measurement of the Content of Silicon Atoms in Silicon-Containing Oxide-Coated Aluminum Nitride Particles>

The content of silicon atoms in silicon-containing oxide-coated aluminum nitride particles was measured by the following procedure.

(1) To a 20 cc Teflon (trade name) container were added 10 cc of a solution of a 1:2 (volume ratio) mixture of 97 mass % sulfuric acid (Super Special Grade manufactured by Wako Pure Chemical Industries, Ltd.) and ion-exchanged water and 0.5 g of a sample (silicone-containing oxide-coated aluminum nitride particles).

(2) The Teflon (trade name) container was placed in a pressure-resistant, stainless steel container and then maintained at 230° C. for 15 hours so that the added sample was dissolved.

(3) The solution resulting from the mixing step (1) was taken out and then measured for silicon atom concentration using an ICP system (ICPS-7510 manufactured by Shimadzu Corporation). The measured silicon atom concentration was used to calculate the content of silicon atoms in the silicon-containing oxide-coated aluminum nitride particles.

<Measurement of the BET Specific Surface Area of Silicon-Containing Oxide-Coated Aluminum Nitride Particles>

The specific surface area of silicon-containing oxide-coated aluminum nitride particles was determined by a BET method using Macsorb HM Model 1210 manufactured by Mountech Co., Ltd. A mixed gas of 70% by volume of He and 30% by volume of $N_2$ was used as an adsorption gas. The specific surface area of the silicon-containing oxide-coated aluminum nitride particles determined by the BET method is shown in the "BET specific surface area $(m^2/g)$" column of the table.

<Evaluation of Moisture Resistance of Particles>

The moisture resistance of silicon-containing oxide-coated aluminum nitride particles and other particles was measured as follows. To a 50 ml sample tube were added 17 g of an aqueous hydrochloric acid solution with an adjusted pH of 4 and 3 g of silicon-containing oxide-coated aluminum nitride particles. After being sealed, the sample tube was shaken in a shaking thermostatic chamber under the conditions of 85° C., 80 rpm, and 2 hours, and then allowed to stand. The sample tube was then cooled to room temperature (25° C.). The concentration of ammonia in the resulting supernatant was measured at a temperature of 25° C. using an ammonia electrode (Ammonia Electrode 5002A manufactured by Horiba, Ltd.). The measured ammonia concentration is shown together with the measurement temperature in the "Ammonia concentration for moisture resistance" column of the table.

<Measurement of Thermal Conductivity of Resin Formed Product>

The coefficient of thermal diffusivity of a resin formed product was measured at 25° C. using a laser flash thermal diffusivity tester (LFA447 NanoFlash manufactured by NETZSCH). Furthermore, assuming that simple additivity holds for each component, the theoretical specific heat and theoretical density of the resin formed product were calculated using the weighted average determined using the content of each component. The thermal conductivity of the resin formed product in the thickness direction was defined as the value calculated by multiplying the coefficient of thermal diffusivity by the theoretical specific heat and the theoretical density.

The sample used for the measurement of the coefficient of thermal diffusivity was prepared as follows. A 1 mm thick resin formed product with a circular shape 30 mm in inner diameter was obtained as described in the "Production of Resin Formed Product" section. Both sides of the resin formed product were subjected to gold coating using an ion coater (IB-3 manufactured by EIKO Corporation) and then further subjected to graphite coating.

The theoretical specific heat of the resin formed product obtained in each of the examples and comparative examples was calculated using 0.73 J/g·K as the theoretical specific heat of aluminum nitride, 1.80 J/g·K as the theoretical specific heat of the resin component, and 1.80 J/g·K as the theoretical specific heat of the high molecular weight component. The theoretical density of the resin formed product obtained in each of the examples and comparative examples was calculated using 3.26 g/cm$^3$ as the theoretical density of aluminum nitride, 1.17 g/cm$^3$ as the theoretical density of the resin component, and 1.17 g/cm$^3$ as the theoretical density of the high molecular weight component. The solvent was assumed to be volatilized completely, and the amount of the curing agent was ignored since it was very small.

<<Preparation of Particles>>

Example 1

(First Step)

In a rotating/revolving mixer (Awatori Rentaro manufactured by Thinky Corporation), aluminum nitride particles A (TFA-N15P manufactured by Toyo Aluminum K.K.) with a cumulative volume d50 of 16 μm and a BET specific surface area of 0.5 m$^2$/g were mixed with a solution containing an organic silicone compound A (a cyclic methyl hydrogen siloxane tetramer manufactured by Tokyo Chemical Industry Co., Ltd., represented by formula (3) with n equal to 4) dissolved in CH$_2$Cl$_2$ (boiling point 40° C.). The mixture was mixed by repeating five times an operation including rotation at 2,000 rpm for 20 seconds and then cooling. The organic silicone compound A was used in an amount of 0.2 parts by mass based on 100 parts by mass of the aluminum nitride particles A. The mixture was then heated at 40° C. for 6 hours in air, so that CH$_2$Cl$_2$ was completely removed. As a result, aluminum nitride particles coated with the organic silicone compound were obtained.

(Second Step)

The organic silicone compound-coated aluminum nitride particles resulting from the first step were heated at 650° C. for 1.5 hours in air, so that silica-coated aluminum nitride particles were obtained, which correspond to silicon-containing oxide-coated aluminum nitride particles.

Example 2

Silica-coated aluminum nitride particles (corresponding to silicon-containing oxide-coated aluminum nitride particles) were obtained as in Example 1, except that the amount of the organic silicone compound A was changed to 3.3 parts by mass based on 100 parts by mass of the aluminum nitride particles A.

Example 3

Silica-coated aluminum nitride particles (corresponding to silicon-containing oxide-coated aluminum nitride particles) were obtained as in Example 1, except that the amount of the organic silicone compound A was changed to 16.7 parts by mass based on 100 parts by mass of the aluminum nitride particles A.

Example 4

Silica-coated aluminum nitride particles (corresponding to silicon-containing oxide-coated aluminum nitride particles) were obtained as in Example 2, except that, after the second step, the first and second steps were repeated in order.

Example 5

Silica-coated aluminum nitride particles (corresponding to silicon-containing oxide-coated aluminum nitride particles) were obtained as in Example 1, except that the aluminum nitride particles A were changed to aluminum nitride particles B (FAN-f50-A1 manufactured by Furukawa Electric Co., Ltd.) with a cumulative volume d50 of 50 μm and a BET specific surface area of 0.07 m$^2$/g and 0.7 parts by mass of the organic silicone compound A was dissolved in CH$_2$Cl$_2$ based on 100 parts by mass of the aluminum nitride particles B.

Example 6

Silica-coated aluminum nitride particles (corresponding to silicon-containing oxide-coated aluminum nitride particles) were obtained as in Example 5, except that the amount of the organic silicone compound A was changed to 16.7 parts by mass based on 100 parts by mass of the aluminum nitride particles B.

Example 7

Silica-coated aluminum nitride particles (corresponding to silicon-containing oxide-coated aluminum nitride particles) were obtained as in Example 5, except that the organic silicone compound A was changed to an organic silicone compound B (KF-99-P (product name) manufactured by Shin-Etsu Chemical Co., Ltd., represented by formula (2) in which R1 is a methyl group, R2 is hydrogen, and m is 1) and 0.7 parts by mass of the organic silicone compound B was dissolved in CH$_2$Cl$_2$ based on 100 parts by mass of the aluminum nitride particles B.

Example 8

Silica-coated aluminum nitride particles (corresponding to silicon-containing oxide-coated aluminum nitride particles) were obtained as in Example 5, except that, after the second step, the first and second steps were repeated in order.

Example 9

Aluminum nitride particles coated with a complex oxide including silicon and aluminum (corresponding to silicon-containing oxide-coated aluminum nitride particles) were obtained as in Example 1, except that the heating temperature in the second step was 900° C.

Example 10

Silica-coated aluminum nitride particles (corresponding to silicon-containing oxide-coated aluminum nitride particles) were obtained as in Example 1, except that the heating temperature in the second step was 400° C.

Comparative Example 1

The aluminum nitride particles A (untreated particles having undergone none of the steps in the example) were used as particles of Comparative Example 1.

Comparative Example 2

The aluminum nitride particles B (untreated particles having undergone none of the steps in the example) were used as particles of Comparative Example 2.

Comparative Example 3

The process was performed as in Example 1, except that the heating temperature in the second step was 1,100° C.

Comparative Example 4

The process was performed as in Example 1, except that the heating temperature in the second step was 200° C. The resulting particles did not have any silicon-containing oxide coating, such as a silica coating, on their surface.

<<Production of Resin Formed Product>>

A curable liquid epoxy resin (a bisphenol A epoxy resin with an epoxy equivalent of 189, YD128 manufactured by Nippon Steel & Sumikin Chemical Co., Ltd.) as a resin component and a bisphenol A phenoxy resin (YP-50S (trade name) with a purity of at least 99.0% by mass, manufactured by Nippon Steel & Sumikin Chemical Co., Ltd.) with a polystyrene-equivalent weight average molecular weight of 40,000 as a high molecular weight component were mixed in the amounts (parts by mass) shown in Tables 1 and 2 to form resin mixtures. The particles obtained in each of Examples 1 to 10 and Comparative Examples 1 to 4, the resin mixture, and a curing agent (2-ethyl-4-methylimidazole, manufactured by Tokyo Chemical Industry Co., Ltd.) were mixed in the amounts (parts by mass) shown in Table 1 or 2 and stirred manually. A solvent (1-methoxy-2-propanol) was then added dropwise to the mixture so that the mixture was diluted to a concentration enabling sheet coating. The resulting mixture was then stirred five times at 2,000 rpm for 30 seconds using a rotating/revolving mixer (Awatori Rentaro manufactured by Thinky Corporation). The resulting composition was formed into a sheet using, as a coating base, a PET film with one side treated with a release agent. Specifically, the resulting composition was applied to the release-treated surface of the PET film to form a 500 μm-thick resin composition layer using a coater. The resin composition layer was then dried under vacuum at 50° C. for 20 minutes so that the solvent was volatilized. After the completion of volatilization of the solvent was checked, the resin composition layer was scraped from the PET film base and then dried again under vacuum at 50° C. for 20 minutes, so that a completely solvent-free composition was obtained. The resulting composition was in the form of a clay or a powder. Thereafter, a 188 μm thick PET film was placed on a steel sheet, and a 35 μm thick copper foil with a surface coated with a release agent was stacked on the PET film. A 1 mm thick, cylindrical steel mold having an inner diameter of 30 mm and an inner wall coated with a release agent was placed on the surface of the copper foil, and then filled with the composition obtained in the form of a clay or a powder as describe above. A copper foil with a surface coated with a release agent for contact with the composition, a PET film, and a steel sheet were stacked in this order on the composition, similarly to those under the mold, so that the composition was sandwiched between the stacks. The resulting product was subjected to hot pressing at 120° C. for 30 minutes, so that the resin composition layer was cured. As a result, a circular resin formed product (epoxy resin formed product) with a thickness of 1 mm and an inner diameter of 30 mm was obtained.

The content of the particles (vol %) in the resin formed product according to each of the examples and the comparative examples was calculated using 3.26 g/cm$^3$ as the theoretical density of aluminum nitride, 1.17 g/cm$^3$ as the theoretical density of the resin component, and 1.17 g/cm$^3$ as the theoretical density of the high molecular weight component, assuming that simple additivity holds for each component. The solvent was assumed to be volatilized completely, and the amount of the curing agent was ignored since it was very small.

Regarding the particles obtained in the examples and the comparative examples, Tables 1 and 2 show the results of the measurement of the content of carbon atoms in the silicon-containing oxide-coated aluminum nitride particles, the measurement of the content of silicon atoms in the silicon-containing oxide-coated aluminum nitride particles, the measurement of the BET specific surface area of the silicon-containing oxide-coated aluminum nitride particles, the evaluation of the moisture resistance of the particles, and the measurement of the thermal conductivity of the resin formed product.

The particles of Examples 1 to 10 had higher moisture resistance than the particles of Comparative Examples 1 to 4. The resin formed products produced using the particles of Examples 1 to 10 had thermal conductivities similar to those of the resin formed products produced using the particles of Comparative Examples 1 to 4. These results indicate that the silicon-containing oxide-coated aluminum nitride particles of Examples 1 to 10 obtained by production methods according to the present invention maintain the high thermal conductivity of aluminum nitride particles and have markedly improved thermal resistance as compared to the particles of Comparative Examples 1 and 2 in which silicon-containing oxide coating treatment is not performed or as compared to the particles of Comparative Examples 3 and 4 in which the heating temperature in the second step falls outside the range according to the present invention. In particular, the particles of Examples 1 to 4, 9, and 10 produced using aluminum nitride particles with a d50 of at most 30 μm had high thermal conductivity.

TABLE 1

| | Items | | Example 1 | Example 2 | Example 3 | Example 4 |
|---|---|---|---|---|---|---|
| Particles | Type of aluminum nitride particles | Aluminum nitride particles A | ○ | ○ | ○ | ○ |
| | | Aluminum nitride particles B | — | — | — | — |
| | Material for forming silicon-containing oxide coating | Type Organic silicone compound A | ○ | ○ | ○ | ○ |
| | | Organic silicone compound B | — | — | — | — |
| | | Parts by mass based on 100 parts by mass of aluminum nitride particles | 0.2 | 3.3 | 16.7 | 3.3 × 2 |
| | Heat treatment conditions in second step | Heating temperature (° C.) | 650 | 650 | 650 | 650 |
| | | Heating time (h) | 1.5 | 1.5 | 1.5 | 1.5 |

TABLE 1-continued

|  |  | Items |  |  |  |  |
|---|---|---|---|---|---|---|
|  | Properties | Content of silicon atoms (parts by mass) | 348 | 483 | 729 | 656 |
|  |  | Content of carbon atoms (parts by mass) | 60 | 90 | 80 | 60 |
|  |  | BET specific surface area (m²/g) | 0.36 | 0.42 | 0.65 | 0.45 |
|  |  | Content of silicon atoms/BET specific surface area (mass ppm g/m²) | 967 | 1150 | 1122 | 1458 |
|  |  | Ammonia concentration for moisture resistance (mg/L) (85° C.) | 32 | 8 | 18 | 14 |
| Resin formed product | Composition (parts by mass) | Particles | 100.0 | 100.0 | 100.0 | 100.0 |
|  |  | Epoxy resin | 17.3 | 17.3 | 17.3 | 17.3 |
|  |  | High molecular weight component | 1.9 | 1.9 | 1.9 | 1.9 |
|  |  | Curing agent | 0.1 | 0.1 | 0.1 | 0.1 |
|  |  | Content of particles (vol %) | 65.0 | 65.0 | 65.0 | 65.0 |
|  | Thermal conductivity (W/m/K) |  | 13 | 12 | 13 | 13 |

|  |  | Items | Example 5 | Example 6 | Example 7 |
|---|---|---|---|---|---|
| Particles | Type of aluminum nitride particles | Aluminum nitride particles A | — | — | — |
|  |  | Aluminum nitride particles B | ○ | ○ | ○ |
|  | Material for forming silicon-containing oxide coating | Type Organic silicone compound A | ○ | ○ | ○ |
|  |  | Organic silicone compound B | — | — | — |
|  |  | Parts by mass based on 100 parts by mass of aluminum nitride particles | 0.7 | 16.7 | 0.7 |
|  | Heat treatment conditions in second step | Heating temperature (° C.) | 650 | 650 | 650 |
|  |  | Heating time (h) | 1.5 | 1.5 | 1.5 |
|  | Properties | Content of silicon atoms (parts by mass) | 153 | 389 | 2158 |
|  |  | Content of carbon atoms (parts by mass) | 90 | 100 | 110 |
|  |  | BET specific surface area (m²/g) | 0.15 | 0.24 | 1.31 |
|  |  | Content of silicon atoms/BET specific surface area (mass ppm g/m²) | 1020 | 1621 | 1647 |
|  |  | Ammonia concentration for moisture resistance (mg/L) (85° C.) | 8 | 4 | 2 |
| Resin formed product | Composition (parts by mass) | Particles | 100.0 | 100.0 | 100.0 |
|  |  | Epoxy resin | 17.3 | 17.3 | 17.3 |
|  |  | High molecular weight component | 1.9 | 1.9 | 1.9 |
|  |  | Curing agent | 0.1 | 0.1 | 0.1 |
|  |  | Content of particles (vol %) | 65.0 | 65.0 | 65.0 |
|  | Thermal conductivity (W/m/K) |  | 6 | 7 | 7 |

TABLE 2

|  |  | Items | Example 8 | Example 9 | Example 10 | Comparative Example 1 |
|---|---|---|---|---|---|---|
| Particles | Type of aluminum nitride particles | Aluminum nitride particles A | — | ○ | ○ | ○ |
|  |  | Aluminum nitride particles B | ○ | — | — | — |
|  | Material for forming silicon-containing oxide coating | Type Organic silicone compound A | — | ○ | ○ |  |
|  |  | Organic silicone compound B | ○ | — | — |  |
|  |  | Parts by mass based on 100 parts by mass of aluminum nitride particles | 0.7 × 2 | 0.2 | 0.2 |  |
|  | Heat treatment conditions in second step | Heating temperature (° C.) | 650 | 900 | 400 |  |
|  |  | Heating time (h) | 1.5 | 1.5 | 1.5 |  |
|  | Properties | Content of silicon atoms (parts by mass) | 211 | 405 | 374 | 300 |
|  |  | Content of carbon atoms (parts by mass) | 90 | 60 | 80 | 70 |
|  |  | BET specific surface area (m²/g) | 0.13 | 0.38 | 0.34 | 0.50 |
|  |  | Content of silicon atoms/BET specific surface area (mass ppm · g/m²) | 1623 | 1068 | 1100 | 600 |
|  |  | Ammonia concentration for moisture resistance (mg/L) (85° C.) | 9 | 22 | 524 | 21800 |
| Resin formed product | Composition (parts by mass) | Particles | 100.0 | 100.0 | 100.0 | 100.0 |
|  |  | Epoxy resin | 17.3 | 17.3 | 17.3 | 17.3 |
|  |  | High molecular weight component | 1.9 | 1.9 | 1.9 | 1.9 |
|  |  | Curing agent | 0.1 | 0.1 | 0.1 | 0.1 |
|  |  | Content of particles (vol %) | 65.0 | 65.0 | 65.0 | 65.0 |
|  | Thermal conductivity (W/m/K) |  | 7 | 13 | 12 | 13 |

TABLE 2-continued

| | Items | | Comparative Example 2 | Comparative Example 3 | Comparative Example 4 |
|---|---|---|---|---|---|
| Particles | Type of aluminum nitride particles | Aluminum nitride particles A | — | ○ | ○ |
| | | Aluminum nitride particles B | ○ | — | — |
| | Material for forming silicon-containing oxide coating | Type  Organic silicone compound A | | ○ | ○ |
| | | Organic silicone compound B | — | — | — |
| | | Parts by mass based on 100 parts by mass of aluminum nitride particles | | 0.2 | 0.2 |
| | Heat treatment conditions in second step | Heating temperature (° C.) | | 1100 | 200 |
| | | Heating time (h) | | 1.5 | 1.5 |
| | Properties | Content of silicon atoms (parts by mass) | 74 | 366 | 378 |
| | | Content of carbon atoms (parts by mass) | 80 | 70 | 270 |
| | | BET specific surface area (m²/g) | 0.07 | 0.45 | 0.39 |
| | | Content of silicon atoms/BET specific surface area (mass ppm · g/m²) | 1057 | 813 | 969 |
| | | Ammonia concentration for moisture resistance (mg/L) (85° C.) | 9400 | 3000 | 15500 |
| Resin formed product | Composition (parts by mass) | Particles | 100.0 | 100.0 | 100.0 |
| | | Epoxy resin | 17.3 | 17.3 | 17.3 |
| | | High molecular weight component | 1.9 | 1.9 | 1.9 |
| | | Curing agent | 0.1 | 0.1 | 0.1 |
| | | Content of particles (vol %) | 65.0 | 65.0 | 65.0 |
| | Thermal conductivity (W/m/K) | | 9 | 10 | 12 |

The invention claimed is:

1. A method for producing silicon-containing oxide-coated aluminum nitride particles comprising aluminum nitride particles and a silicon-containing oxide coating covering a surface of each of the aluminum nitride particles, the method comprising:

a first step comprising mixing aluminum nitride particles and an organic silicone compound solution consisting of an organic silicone compound having a structure represented by formula (1) below and a solvent to form a mixture consisting of the aluminum nitride particles, the organic silicone compound and the solvent and then heating the mixture to remove the solvent and to obtain aluminum nitride particles coated with the organic silicone compound; and a second step comprising heating the aluminum nitride particles coated with the organic silicone compound at a temperature of 300° C. or more and 1,000° C. or less,

(1)

wherein R is an alkyl group having 4 or less carbon atoms.

2. The method according to claim 1 for producing silicon-containing oxide-coated aluminum nitride particles, wherein the organic silicone compound having the structure represented by formula (1) comprises at least one of a compound represented by formula (2) below and a compound represented by formula (3) below,

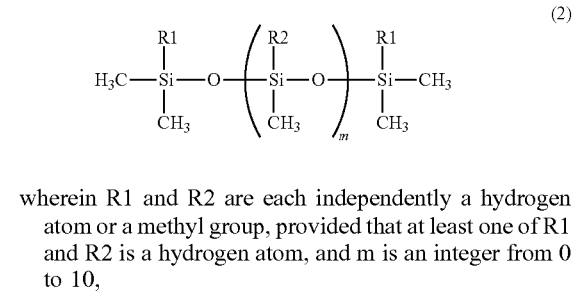

(2)

wherein R1 and R2 are each independently a hydrogen atom or a methyl group, provided that at least one of R1 and R2 is a hydrogen atom, and m is an integer from 0 to 10,

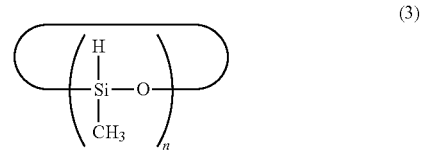

(3)

wherein n is an integer from 3 to 6.

3. The method according to claim 1 for producing silicon-containing oxide-coated aluminum nitride particles, wherein the aluminum nitride particles have a cumulative volume d50 of 10 μm or more and 60 μm or less.

4. The method according to claim 1 for producing silicon-containing oxide-coated aluminum nitride particles, wherein the heating in the first step is heating the mixture containing the aluminum nitride particles and the organic silicone compound dissolved in the solvent at a temperature of 35° C. or more and 200° C. or less, thereby removing the solvent.

5. A method for producing an exoergic resin composition, the method comprising a mixing step comprising mixing a resin and the silicon-containing oxide-coated aluminum nitride particles produced by the method according to claim 1.

6. The method according to claim 1 for producing silicon-containing oxide-coated aluminum nitride particles, wherein, the second step comprises heating the aluminum nitride particles coated with the organic silicone compound at a temperature of 500° C. or more and 1,000° C. or less.

7. The method according to claim 1 for producing silicon-containing oxide-coated aluminum nitride particles, wherein, the second step comprises heating the aluminum nitride particles coated with the organic silicone compound at a temperature of 650° C. or more and 1,000° C. or less.

8. The method according to claim 4, for producing silicon-containing oxide-coated aluminum nitride particles, wherein the solvent is dichloromethane ($CH_2Cl_2$) or toluene.

9. The method according to claim 1 for producing silicon-containing oxide-coated aluminum nitride particles, wherein the organic silicone compound having the structure represented by formula (1) comprises a compound represented by formula (2) below,

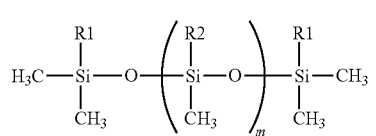

(2)

wherein R1 and R2 are each independently a hydrogen atom or a methyl group, provided that at least one of R1 and R2 is a hydrogen atom, and m is an integer from 0 to 10.

10. The method according to claim 1 for producing silicon-containing oxide-coated aluminum nitride particles, wherein the organic silicone compound having the structure represented by formula (1) comprises a compound represented by formula (3) below,

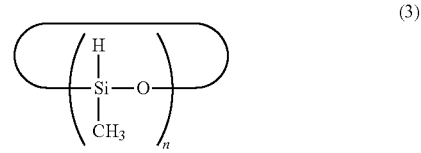

(3)

wherein n is an integer from 3 to 6.

11. The method according to claim 1 for producing silicon-containing oxide-coated aluminum nitride particles, wherein
the solvent is dichloromethane ($CH_2Cl_2$) or toluene.

\* \* \* \* \*